(12) United States Patent
Grigg et al.

(10) Patent No.: US 6,984,545 B2
(45) Date of Patent: Jan. 10, 2006

(54) METHODS OF ENCAPSULATING SELECTED LOCATIONS OF A SEMICONDUCTOR DIE ASSEMBLY USING A THICK SOLDER MASK

(75) Inventors: Ford B. Grigg, Meridian, ID (US); William J. Reeder, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 10/201,208

(22) Filed: Jul. 22, 2002

(65) Prior Publication Data

US 2004/0014255 A1 Jan. 22, 2004

(51) Int. Cl.
H01L 21/44 (2006.01)

(52) U.S. Cl. .................. 438/118; 438/127; 257/737; 257/738; 257/782; 257/783; 257/787

(58) Field of Classification Search ............... 438/118, 438/127; 257/737, 738, 782, 783, 787
See application file for complete search history.

(56) References Cited

U.S. PATENT DOCUMENTS

| | | | | |
|---|---|---|---|---|
| 5,181,984 A | * | 1/1993 | Matsumura et al. | 216/12 |
| 6,017,776 A | | 1/2000 | Jiang et al. | 438/118 |
| 6,048,755 A | | 4/2000 | Jiang et al. | 438/118 |
| 6,049,129 A | | 4/2000 | Yew et al. | 257/737 |
| 6,150,193 A | * | 11/2000 | Glenn | 438/113 |
| 6,177,723 B1 | | 1/2001 | Eng et al. | 257/691 |
| 6,214,645 B1 | | 4/2001 | Kim | 438/110 |
| 6,246,124 B1 | | 6/2001 | Jimarez et al. | 257/790 |
| 6,251,488 B1 | | 6/2001 | Miller et al. | |
| 6,259,962 B1 | | 7/2001 | Gothait | |
| 6,268,584 B1 | | 7/2001 | Keicher et al. | |

(Continued)

FOREIGN PATENT DOCUMENTS

WO    WO 97/01865    1/1997

OTHER PUBLICATIONS

U.S. patent application Publication 2002/0043711 A1 to Akram et al., dated Apr. 18, 2002.
U.S. patent application Publication 2002/0105074 A1 to Akram et al., dated Aug. 8, 2002.
U.S. patent application Publication 2002/0171177 A1 to Kritchman et al., dated Nov. 21, 2002.
U.S. patent application Publication 2003/0022462 A1 to Farnworth et al., dated Jan. 30, 2003.
U.S. patent application Publication 2003/0043360 A1 to Farnworth, dated Mar. 6, 2003.
U.S. patent application Publication 2003/0068840 A1 to Grigg, dated Apr. 10, 2003.

(Continued)

*Primary Examiner*—Van Thu Nguyen
*Assistant Examiner*—Christian D. Wilson
(74) *Attorney, Agent, or Firm*—TraskBritt, PC (57) ABSTRACT

A solder mask includes an opening through which intermediate conductive elements may be positioned between bond pads of a semiconductor die exposed through an aligned opening in a carrier substrate to which the solder mask is secured and corresponding contact areas of the carrier substrate. An assembly is formed by forming the solder mask on or securing the solder mask to the carrier substrate. The semiconductor die is then attached to the carrier substrate such that bond pads of the semiconductor die are exposed through the aligned openings in the carrier substrate and solder mask. Intermediate conductive elements are then used to electrically connect the bond pads to corresponding contact areas on the carrier substrate. An encapsulant material is introduced into an area defined by the solder mask and carrier substrate openings such that the intermediate conductive elements and semiconductor die surface within the aligned openings are encapsulated.

28 Claims, 4 Drawing Sheets

U.S. PATENT DOCUMENTS

| | | |
|---|---|---|
| 6,326,698 B1 | 12/2001 | Akram |
| 6,329,224 B1 | 12/2001 | Nguyen et al. ............. 438/127 |
| 6,391,251 B1 | 5/2002 | Keicher et al. |
| 6,461,881 B1 | 10/2002 | Farnworth et al. |
| 6,469,897 B2 * | 10/2002 | Ho et al. .................... 361/704 |
| 6,479,887 B1 * | 11/2002 | Yoon et al. ................. 257/666 |
| 6,506,671 B1 | 1/2003 | Grigg |
| 6,525,408 B2 | 2/2003 | Akram et al. |
| 6,531,335 B1 | 3/2003 | Grigg |
| 6,537,842 B2 | 3/2003 | Akram |
| 6,544,821 B2 | 4/2003 | Akram |
| 6,544,902 B1 | 4/2003 | Farnworth |
| 6,548,897 B2 | 4/2003 | Grigg |
| 6,569,753 B1 | 5/2003 | Akram et al. |
| 6,611,053 B2 | 8/2003 | Akram |
| 6,630,365 B2 | 10/2003 | Farnworth et al. |
| 6,630,730 B2 | 10/2003 | Grigg |
| 6,649,444 B2 | 11/2003 | Earnworth et al. |
| 2002/0043711 A1 * | 4/2002 | Akram et al. ............... 257/690 |
| 2003/0170921 A1 * | 9/2003 | Akram ....................... 438/15 |
| 2004/0005770 A1 * | 1/2004 | Farnworth et al. .......... 438/612 |
| 2004/0032020 A1 * | 2/2004 | Akram ....................... 257/690 |
| 2004/0077109 A1 * | 4/2004 | Tan et al. .................... 438/1 |

OTHER PUBLICATIONS

U.S. patent application Publication 2003/0089999 A1 to Akram, dated May 15, 2003.

U.S. patent application Publication 2003/0092220 A1 to Akram, dated May 15, 2003.

U.S. patent application Publication 2003/0098499 A1 to Akram et al., dated May 29, 2003.

U.S. patent application Publication 2003/0139030 A1 to Grigg, dated Jul. 24, 2003.

U.S. patent application Publication 2003/0151167 A1 to Kritchman et al., dated Aug. 14, 2003.

U.S. patent application Publication 2003/0170921 A1 to Akram, dated Sep. 11, 2003.

U.S. patent application Publication 2003/0173665 A1 to Grigg, dated Sep. 18, 2003.

U.S. patent application Publication 2003/0176016 A1 to Grigg, dated Sep. 18, 2003.

U.S. patent application Publication 2003/0180974 A1 to Akram, dated Sep. 25, 2003.

U.S. patent application Publication 2003/0181003 A1 to Akram, dated Sep. 25, 2003.

U.S. patent application Publication 2003/0186496 A1 to Akram, dated Oct. 2, 2003.

U.S. patent application Publication 2003/0193092 A1 to Tan et al., dated Oct. 16, 2003.

U.S. patent application Publication 2003/0203612 A1 to Akram et al., dated Oct. 30, 2003.

U.S. patent application Publication 2003/0207213 A1 to Farnworth, dated Nov. 6, 2003.

Miller et al., "Maskless Mesoscale Materials Deposition", Deposition Technology, Sep. 2001, pp. 20–22.

Miller, "New Laser–Directed Deposition Technology", Microelectronic Fabrication, Aug. 2001, p. 16.

Brochure, Photopolymer materials and Support Resins, Object Prototyping the Future, Object FullCure 700 Series, 1 page (2003).

Brochure, How it Works, Object Prototyping the Future, 2 pages (2003).

* cited by examiner

METHODS OF ENCAPSULATING SELECTED LOCATIONS OF A SEMICONDUCTOR DIE ASSEMBLY USING A THICK SOLDER MASK

BACKGROUND OF THE INVENTION

1. Field of the Invention

The present invention relates generally to solder masks and use thereof in packaging semiconductor devices and, more specifically, to a method for encapsulating portions of a semiconductor device package using a solder mask as a mold for the encapsulant material.

2. State of the Art

As the dimensions of electronic devices are ever decreasing, the sizes of the structures used to package the microprocessors, memory devices, other semiconductor devices, and other electronic componentry must also become more compact.

One approach to reducing the size of semiconductor device assemblies is to minimize the profiles of the semiconductor devices, as well as the connectors and the electronic components to which the semiconductor devices are electrically connected, as well as to minimize the overall profiles of such assemblies. One type of packaging technology that has been developed to save space in this manner is the so-called "chip-scale package" (CSP).

An example of a CSP designed to save space is a board-over-chip (BOC) package. A typical BOC package comprises a carrier substrate that is configured to be secured over the active surface of a semiconductor die, wherein bond pads of the semiconductor die are exposed through an opening formed through the carrier substrate. The bond pads on the semiconductor die are connected to conductive elements on the carrier substrate using a step where wire bonds are formed and electrically connect the bonds pads to the conductive elements.

Following wire bonding, it is desirable to encapsulate the wire bonds between the semiconductor die and the carrier substrate. Encapsulation serves a variety of functions, including sealing the encapsulated surfaces from moisture and contamination and protecting the wire bonds and other components from corrosion and mechanical shock.

Encapsulants may be deposited from the top of the carrier substrate to encapsulate the semiconductor die and wire bonds. The material used for the encapsulant typically comprises a flowable, dielectric material. Alternatively, a glob-top or other encapsulant may be formed over the wire bonds for protection. Glob-top structures use a high viscosity encapsulant, typically a silicone or an epoxy, such that the encapsulating material may be applied to a substantially planar surface without being laterally confined. However, the height of the resulting glob-top structure may be higher than is required to properly encapsulate the wire bonds and may interfere with subsequent packaging steps.

After encapsulation, a solder stencil or solder mask may be placed or formed on the surface of the carrier substrate. Solder stencils and solder masks typically include a number of openings in which solder balls may be placed or formed.

Conventional solder paste stencils and solder ball placement stencils are substantially planar metal structures that are aligned with and secured to a bond pad-bearing surface of a semiconductor device or a terminal-bearing surface of a carrier substrate, such as a printed circuit board, on which solder balls are to be formed. Apertures that have been formed through the stencil are aligned with corresponding bond pads or terminals. Such conventional solder stencils are designed to resist the adherence of solder and, thus, of the formed solder balls thereto. Once such a solder stencil has been secured to a semiconductor device or a carrier substrate, solder may be introduced onto the solder stencil, for example, by at least partially immersing the component or an assembly that includes the component in a solder bath to form solder balls on bond pads or terminals that are exposed through apertures of the solder stencil. When solder balls have been formed, a conventional metal solder stencil is typically removed from the component from which the solder balls protrude, cleaned, and reused.

State-of-the-art solder masks are typically single-use structures that are formed directly on the component on which solder balls are to be formed. These single-use solder masks may be formed from a photoimageable material that, when cured, will withstand the conditions to which such solder masks will be exposed, such as the typically high temperatures of molten solder. Solder balls may be formed by employing the same types of techniques, as described above, that are used with conventional, metal solder masks. Once the solder balls are formed, if the single-use solder mask was formed from a dielectric material and the solder balls protrude a sufficient distance therefrom, the single-use solder mask may remain in place on the component. Alternatively, the solder mask may be removed from the component, such as by use of suitable photoresist stripping agents, to further expose the solder balls.

The solder mask prevents bridging of the solder material and shorting between the solder balls in the completed package. The presence of a glob-top structure may, however, make it difficult to place the solder mask over the carrier substrate, particularly if the glob-top material has moved too far laterally.

Accordingly, there is a need for a solder mask that may be positioned on a carrier substrate of a semiconductor device assembly prior to encapsulation of bond wires and which may remain in place as wire bonding operations are being conducted, as well as for assemblies and packages including such solder masks and methods for forming and using such solder masks.

BRIEF SUMMARY OF THE INVENTION

The present invention relates generally to solder masks and use thereof in packaging semiconductor devices and, more specifically, to a method for encapsulating components of a package using a solder mask as a mold for the encapsulant material.

An exemplary assembly or packaging method of the present invention includes providing a carrier substrate (e.g., a flexible, tape-type interposer, a rigid interposer, leads, etc.) with a slot formed therethrough, and forming or placing a solder mask on a contact area-bearing first surface of the carrier substrate. The solder mask includes an opening through which the slot and first contact areas of the carrier substrate are exposed, as well as an array of smaller openings that align with and expose corresponding second contact areas of the carrier substrate. A semiconductor die may be secured to an opposite, second surface of the carrier substrate and bond pads of the semiconductor die may be electrically connected to corresponding contact areas on the first surface of the carrier substrate by positioning or forming intermediate conductive elements (e.g., bond wires, bonded leads, conductive tape-automated bonding (TAB) elements carried by a flexible dielectric film, etc.) therebetween. The intermediate conductive elements are then completely covered with an encapsulant material, which is laterally confined within the central opening of the solder mask. As the solder mask laterally confines the encapsulant material, relatively low viscosity encapsulant materials may be used, resulting in an encapsulant structure which does not protrude significantly above the exposed surface of the solder mask. Subsequently, conductive structures, such as solder balls, may be formed on contact areas of the carrier substrate that are exposed through apertures of the solder mask.

A semiconductor device assembly or package incorporating teachings of the present invention includes a substantially planar carrier substrate with a solder mask formed or positioned on a first surface thereof. A semiconductor die may be secured to an opposite, second surface of the carrier substrate, with at least one intermediate conductive element electrically connecting a bond pad of the semiconductor die and a corresponding first contact area of the carrier substrate. The assembly or package may also include a quantity of encapsulant material, which is laterally confined by the solder mask and encapsulates the at least one intermediate conductive element. Additionally, the assembly or package may include at least one conductive structure, such as a solder ball, secured to a corresponding second contact area of the carrier substrate and protruding from the exposed surface of the solder mask.

BRIEF DESCRIPTION OF THE SEVERAL VIEWS OF THE DRAWINGS

The nature of the present invention as well as exemplary embodiments and other features and advantages of the present invention may be more clearly understood by reference to the following detailed description of the invention, to the appended claims, and to the several drawings herein, wherein:

DETAILED DESCRIPTION OF THE INVENTION

Generally, the present invention includes methods of encapsulating intermediate conductive elements, such as bond wires, and semiconductor dice in assemblies and relatively thin-profile packages in which a carrier substrate is secured to the active surface of a semiconductor die, such as BOC-type assemblies and packages, including, without limitation, BGA configurations, tape BGA (TBGA) configurations, and micro tape BGA (MTBGA) configurations of such assemblies and packages. While the present invention is described in terms of certain specific, exemplary embodiments, the specific details of these embodiments are set forth in order to provide a thorough understanding of the present invention. It will be apparent, however, that the present invention may be practiced in various combinations of the specific exemplary embodiments presented herein.

It will be appreciated that the drawings described herein are not drawn to scale, but are for exemplary purposes only. Referring now to drawing FIG. 1A, there is shown a cross-sectional view of an assembly generally at 10 that includes a solder mask 12 according to the present invention and a carrier substrate 15 upon which the solder mask 12 is carried. In the illustrated embodiment, the carrier substrate 15 is an interposer with opposite major surfaces 16 and 18. A slot 17 or other opening is formed through the carrier substrate 15, somewhat centrally in the depicted embodiment, and extends from upper surface 16 to lower surface 18. As known to those of ordinary skill in the art, the carrier substrate 15 may be formed to a desired shape and thickness and with required features for use in forming a functional semiconductor package.

The material used to fabricate the carrier substrate 15 may comprise a relatively thin, flexible film of an electrically insulative material, such as an organic polymer resin (e.g., polyimide). If the carrier substrate 15 comprises an MTBGA substrate, the thickness othereof may be on the order of about 50 $\mu$m to about 75 $\mu$m. Alternatively, the carrier substrate 15 may comprise a somewhat rigid, substantially planar member, which may be fabricated from any known, suitable materials, including, but not limited to, insulator-coated silicon, a glass, a ceramic, an epoxy resin (e.g., FR-4, FR-5, etc.), bismaleimide-triazine (BT) resin, or any other material known in the art to be suitable for use as a carrier substrate. A BT resin substrate may have a thickness of about 125 $\mu$m. Although the illustrated embodiment depicts the carrier substrate 15 as being an interposer, a solder mask 12 incorporating teachings of the present invention may also be used with other types of carrier substrates, such as circuit boards, leads, and the like, without departing from the scope of the present invention.

Figure 1A:
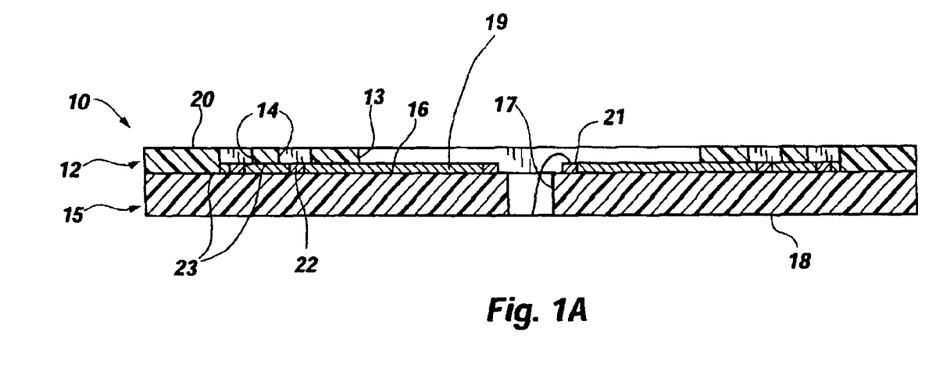
FIGS. 1A and 1B are cross-sectional views of assemblies including the solder mask of the present invention.

As shown, the upper surface 16 of the carrier substrate 15 carries conductive traces 19, first contact areas 21 located proximate the slot 17, and second contact areas 22 located peripherally relative to the first contact areas 21. As shown, the second contact areas 22 are arranged in an area array, although other arrangements of second contact areas are also within the scope of the present invention. It will be appreciated that the conductive traces 19, first contact areas 21, and second contact areas 22 may comprise, without limitation, conductively doped polysilicon, a conductive metal or metal alloy, conductive or conductor-filled elastomer, or any other conductive material used for electrical connections known to those of ordinary skill in the art.

The solder mask 12 is formed as a substantially planar member with a relatively large central opening 13 formed therethrough. In addition, the solder mask 12 includes smaller apertures 14 that are positioned so as to expose corresponding second contact areas 22 of the carrier substrate 15 and to facilitate the formation of solder balls or other discrete conductive elements 52 (FIG. 1B) on the second contact areas 22. As illustrated in FIG. 1A, the solder mask 12, as configured, is superimposed over a substantial portion of the carrier substrate 15 (also shown in FIG. 2). The solder mask 12 has an upper surface 20 and a lower surface 23 (as oriented in FIGS. 1A and 1B). In the illustrated embodiment, the lower surface 23 of the solder mask 12 is secured to the upper surface 16 of the carrier substrate 15. As known in the art, an adhesive material may be used to attach the solder mask 12 to the upper surface 16 of the carrier substrate 15. Alternatively, the material of the solder mask 12 may secure the solder mask 12 to the upper surface 16 of the carrier substrate 15.

The solder mask 12 may be prefabricated and adhered to the carrier substrate 15 or it may be formed on the carrier substrate 15, both processes that are known in the art. The material used for the solder mask 12 is an electrically insulative material and, if it is to remain on a functioning semiconductor die 24 (FIG. 1B), the material of the solder mask 12 may be selected to have a coefficient of thermal expansion (CTE) similar to that of the material used for the carrier substrate 15. When the carrier substrate 15 and solder mask 12 have similar or substantially "matched" CTEs, the likelihood that these elements of a package will be mechanically stressed or that the solder mask 12 will delaminate from the carrier substrate during thermal cycling of a semiconductor die 24 (FIG. 1B), which may occur during testing or operation thereof, is reduced. Materials that may be used for the solder mask 12 include, but are not limited to, plastics, resins, acrylics, urethanes, and polyimides.

As an example of fabrication of the solder mask, known photolithography processes may be employed. When photolithograpy processes are used, a layer of dielectric photoimageable material, such as a photoresist, may be formed on the upper surface 16 of the carrier substrate 15 by known processes, such as by spin-on techniques. The photoimageable material may then be selectively exposed or patterned, then developed, followed by removal of unpolymerized portions thereof to form the solder mask 12 therefrom.

Another exemplary method for forming a solder mask includes screen printing a layer of dielectric material, such as a polyimide, onto selected regions of the upper surface 16 of the carrier substrate 15.

In yet another exemplary method, a solder mask 12 may be formed as either a single layer or a plurality of contiguous, at least partially superimposed, mutually adhered layers of dielectric material by known stereolithography techniques. In such techniques, selected regions of a layer of at least partially unconsolidated material, such as an uncured photoimageable polymer, arc selectively consolidated, such as by exposing the uncured photoimageable polymer in the selected regions to an energy beam comprising a curing wavelength of radiation. This process may be repeated until a structure of the desired height is formed.

Figure 1B:
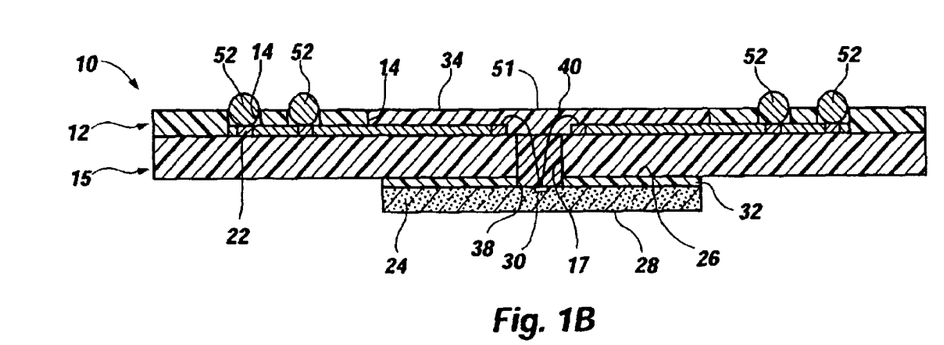

Referring now to FIG. 1B, there is shown a cross section of the assembly 10 of FIG. 1A that also includes a semiconductor die 24. The semiconductor die 24 has an active surface 26 and an opposite back side 28. As known to those of ordinary skill in the art, bond pads 30 are located on the active surface 26 of the semiconductor die 24. The bond pads 30 facilitate the communication of electrical signals to and from various circuit elements, or "integrated circuits" (not shown), that may be present on or within the active surface 26 of the semiconductor die 24. As illustrated, the semiconductor die 24 is attached to the carrier substrate 15 with an adhesive element 32, as known in the art. The adhesive element 32 may comprise a film or tape which is at least partially coated with adhesive material or a quantity of adhesive material, such as a pressure sensitive adhesive or a curable adhesive (e.g., an epoxy). If the adhesive element 32 comprises a polymeric film or tape, the adhesive element may also include an opening 38 therethrough that corresponds to and aligns with the slot 17 in the carrier substrate 15.

Alternatively, the adhesive element 32 may comprise a plurality of individual strips. If the adhesive element 32 comprises strips, any remaining spaces between superimposed portions of the semiconductor die 24 and the carrier substrate 15 may be filled with an underfill material of a type known in the art (e.g., a low viscosity silicone, epoxy, etc.)

Although FIG. 1B depicts the bond pads 30 (shown also in FIG. 2) aligned substantially linearly along the center of the active surface 26 of the semiconductor die 24, it will be appreciated that other bond pad 30 arrangements are meant to be encompassed by the present invention. As depicted in FIG. 1B, after the semiconductor die 24, the adhesive element 32, and the carrier substrate 15 have been properly positioned relative to one another and secured together to form the assembly 10, each bond pad 30 of the semiconductor die 24 may be electrically connected to its corresponding first contact area 21 on the carrier substrate 15. As depicted in FIG. 1B, each such electrical connection may be accomplished with an intermediate conductive element 40, such as a bond wire, a conductive TAB element carried upon a flexible dielectric film, a bonded lead, or the like, which extends between each bond pad 30 and its corresponding first contact area 21, as well as through the slot 17 of the carrier substrate 15.

Figure 2:
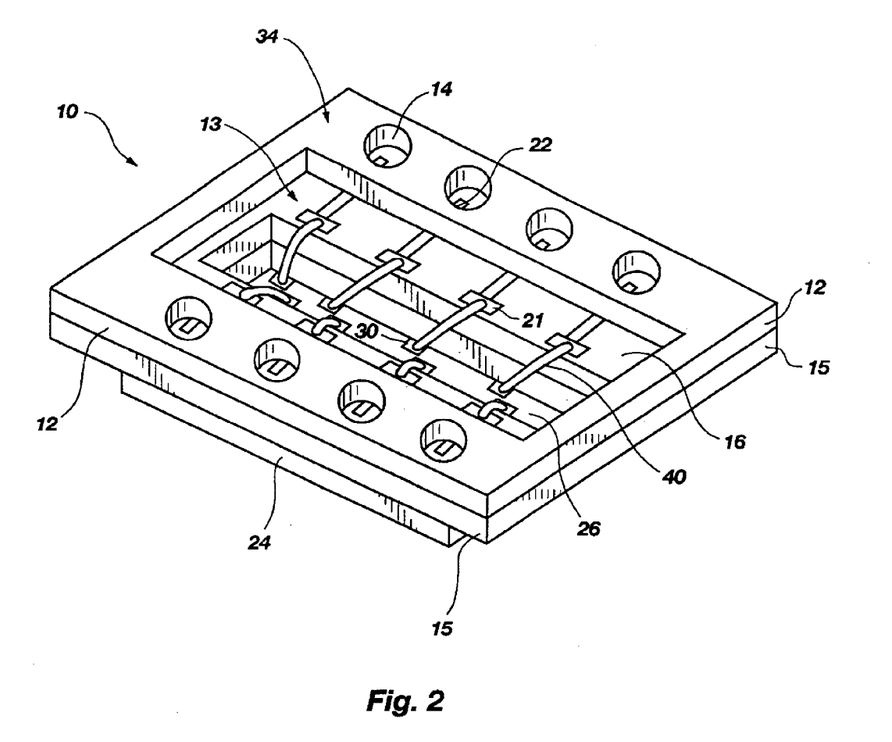
FIG. 2 is a perspective view of the assembly depicted in FIG. 1B.

Referring now to FIG. 2, there is shown a perspective view of the assembly 10 shown in FIG. 1B. As illustrated, the solder mask 12 overlies the periphery of the carrier substrate 15. The central opening 13 in the solder mask 12 exposes the intermediate conductive elements 40, a portion of the upper surface 16 of the carrier substrate 15, the first contact areas 21 of the carrier substrate 15, and a portion of the active surface 26 of the semiconductor die 24 along which the bond pads 30 are located.

Figure 3:
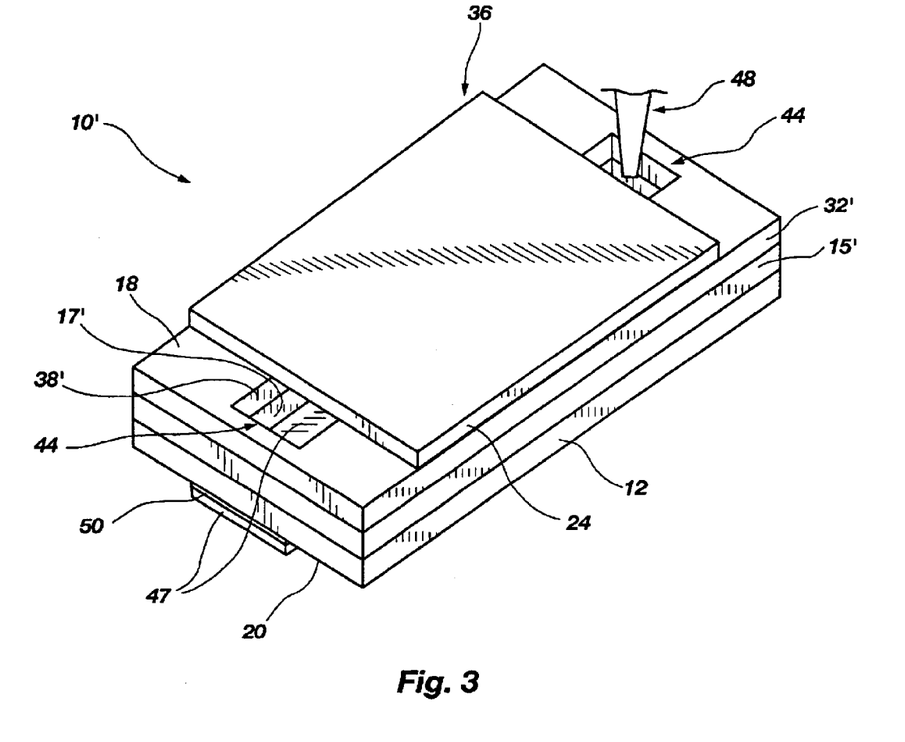
FIG. 3 is an inverted perspective view of the assembly depicted in FIGS. 1B and 2.
Figure 4:
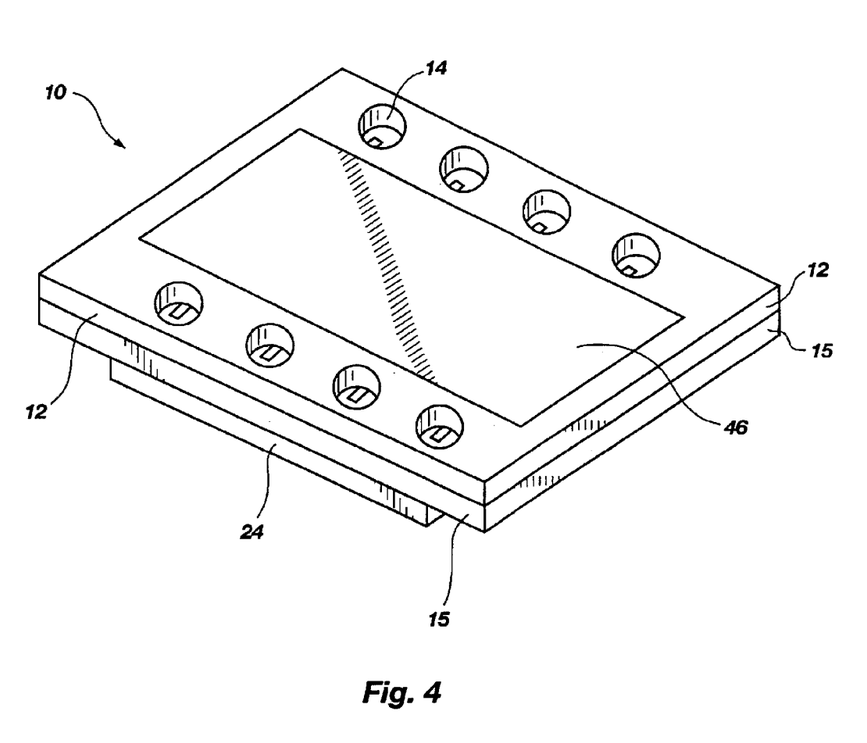
FIG. 4 is a perspective view of the assembly of FIGS. 1B–3 where an encapsulant has been added.

To seal the components from moisture, contamination and corrosion, and to protect against mechanical shock, the components exposed through the central opening 13 in the solder mask 12 are encapsulated. As known to those of ordinary skill in the art, an encapsulant material 46 (as shown in FIG. 4) may be applied from a top side 34 of an assembly 10 of the present invention or from a bottom side 36 of an inverted assembly 10' that incorporates teachings of the present invention, as depicted in FIG. 3. To apply the encapsulant material 46 from the bottom side 36 of the inverted assembly 10', any openings therein from which the encapsulant material 46 may escape may be covered with a coverlet 47.

A suitable, known type of dielectric encapsulant material 46 may be introduced into the central opening 13 of the solder mask 12, as well as into the slot 17 of the carrier substrate 15 and around the intermediate conductive elements 40 that are laterally contained within the central opening 13 and slot 17. As shown in FIG. 2, the slot 17 does not extend beyond an outer periphery of the semiconductor die 24. Thus, the semiconductor die 24, the edges of opening 38 of the adhesive element 32 and of the slot 17 of the carrier substrate 15, and the solder mask 12 together contain the encapsulant material 46. In the illustrated embodiment, the encapsulant material 46 is introduced using an encapsulant dispenser needle 48 (as shown in FIG. 3). However, the encapsulant material 46 may be introduced using any suitable process known in the art. The solder mask 12 functions to laterally confine the encapsulant material 46. The encapsulant material 46 is introduced until an upper surface of the encapsulant material 46 is substantially level with the upper surface 20 of the solder mask 12 if encapsulant material 46 is introduced while an assembly 10 is oriented as shown in FIGS. 1B and 2.

The encapsulant material 46 may comprise a flowable, dielectric material with a CTE substantially the same as the CTEs of the materials from which the carrier substrate 15 and the solder mask 12 are formed. It will be appreciated that the encapsulant material 46 may comprise, but is not limited to, a thermoplastic resin, an epoxy, a polyester, a polyimide, a cyanoacrylate, a silicone, and a urethane. Depending on the type of encapsulant material 46, curing or setting thereof (e.g., by application of heat and/or pressure, by exposure of photoimageable polymer encapsulant materials to an appropriate wavelength of radiation, by use of an appropriate catalyst, or in any other manner known to those of ordinary skill in the art) may be necessary.

Referring now to FIG. 3, there is shown an inverted perspective view of a semiconductor device assembly 10' that includes openings 17' and 38' in the carrier substrate 15' and the adhesive element 32', respectively, that extend beyond at least one outer peripheral edge of the semiconductor die 24, leaving a space 44 uncovered by the semiconductor die 24. A coverlet 47, such as a film, tape, or other substantially planar member, is secured to the upper surface 20 (now inverted) of the solder mask 12. The coverlet 47 may be at least partially coated with an adhesive material 50 to secure the same to the upper surface 20 of the solder mask 12. The adhesive material 50 used on the coverlet 47 facilitates the ready removal of the coverlet 47 from the upper surface 20 of the solder mask 12. The coverlet 47 may also have sufficient flexibility to conform to any irregularities or nonplanaraties of the upper surface 20 of the solder mask 12.

An encapsulant material 46 may be introduced into the bottom side 36 of the assembly 10' through the space 44, which is continuous with the slot 17' of the carrier substrate 15' and the central opening 13 of the solder mask 12, by way of an encapsulant dispenser needle 48 or otherwise, as known in the art. The coverlet 47 precludes loss of encapsulant material 46 during inversion of assembly 10'. Air may be displaced by encapsulant material 46 through the open space 44 at the end of the slot 17', opposite that into which the encapsulant material 46 is introduced.

Referring now to FIG. 4, there is shown the assembly 10 of FIG. 2 after the encapsulant 46 material has cured or set. As previously described, it is apparent that an upper surface 51 of the solidified encapsulant material 46 is substantially coplanar with the upper surface 20 of the solder mask 12. Referring again to FIG. 1B, it will be apparent that the encapsulant 46 material substantially encapsulates the intermediate conductive elements 40, the first contact areas 21, and the bond pads 30 and adjacent regions of the active surface 26 of the semiconductor die 24. The top of each intermediate conductive element 40 and the upper surface 51 of the encapsulant material 46 are separated by a distance which is sufficient to prevent electrical interference between signals passing through intermediate conductive elements 40 and conductive elements or components that are positioned adjacent to the upper surface 51 (FIG. 1B) of the encapsulant material 46. The distance between the top of each intermediate conductive element 40 and the upper surface 51 of the encapsulant material 46 may, for example, be as much as 25 $\mu$m or greater.

Solder balls or other discrete conductive elements 52 (FIG. 1B) may then be formed by known processes, such as by immersing the assembly in a solder bath.

It will be appreciated that the thickness of the solder mask 12 from the upper surface 20 to the lower surface 23 may be varied depending on the height of the intermediate conductive elements 40. It may be desirable to have a layer of encapsulant 46 that is approximately 25 $\mu$m between the upper surface of the intermediate conductive elements 40 and the upper surface 20 of the solder mask 12. Therefore, the solder mask 12 is designed such that once the encapsulant 46 has been dispensed, the upper surface 51 of the encapsulant 46 and the upper surface 20 of the solder mask 12 is approximately 25 $\mu$m above the intermediate conductive elements 40. It may also be desirable to design the solder mask 12 to be about half as thick as solder balls (not shown) to accommodate a subsequent solder ball formation process. Typically, the solder mask 12 of the present invention will be between about 50 $\mu$m and about 100 $\mu$m thick, as opposed to 25–50 $\mu$m thick for conventional solder masks.

Once the encapsulant material 46 has cured or set and solder balls or other discrete conductive elements 52 (FIG. 1B) have been formed in the apertures 14 of the solder mask 12 and on the second contact areas 22 of the carrier substrate 15, it will be appreciated that the solder mask 12 may be left in place during subsequent use (e.g., packaging of the assembly 10 or assembly thereof with other semiconductor device components, such as circuit boards, or other electronic components), or the solder mask 12 may be removed from the assembly 10. When left in place, the solder mask 12 may act as a spacer between the carrier substrate 15 and a higher-level package component or another electronic device (not shown).

Although the present invention has been shown and described with respect to illustrated embodiments, various additions, deletions and modifications that are obvious to a person of ordinary skill in the art to which the invention pertains, even if not shown or specifically described herein, are deemed to lie within the scope of the invention as encompassed by the following claims.

What is claimed is:

1. A method of encapsulating intermediate conductive elements electrically connecting at least one bond pad of a semiconductor die to a corresponding contact area of a carrier substrate, comprising:

providing a carrier substrate comprising at least one contact area on a surface thereof adjacent a central slot formed therethrough;

forming or placing a solder mask having a central opening on the surface of the carrier substrate to a thickness in excess of a predicted height of protrusion above the surface of at least one intermediate conductive element to be connected to the at least one contact area, including aligning the solder mask over at least a portion of the surface of the carrier substrate such that the central opening thereof is aligned with the central slot of the carrier substrate and the at least one contact area of the carrier substrate is exposed through the central opening;

securing a semiconductor die including at least one bond pad to an opposite surface of the carrier substrate with the at least one bond pad exposed through the central opening of the solder mask and the central slot of the carrier substrate;

forming or positioning the at least one intermediate conductive element between the at least one bond pad and the at least one first contact area;

positioning a coverlet over the central opening of the solder mask to substantially cover the central opening of the solder mask while leaving each end of the central opening of the solder mask open; and introducing an encapsulant material only through an open end of the central opening of the solder mask such that the encapsulant material flows into the central slot of the carrier substrate towards the other open end of the central opening of the solder mask, and to a level at least above the surface of the carrier substrate and at least partially confining the encapsulant material within the central opening using the solder mask.

2. The method according to claim 1, wherein the forming or placing the solder mask comprises:
providing a preformed solder mask; and
adhering the preformed solder mask to the surface of the carrier substrate.

3. The method according to claim 1, wherein the forming or placing the solder mask comprises:
applying a quantity of photoimageable material on the surface of the carrier substrate; and
selectively curing the photoimageable material through a mask layer by exposing selected regions of the photoimageable material.

4. The method according to claim 3, wherein the selectively curing is effected by photolithography techniques.

5. The method according to claim 4, further comprising developing the selected regions of the photoimageable material.

6. The method according to claim 3, wherein the selectively curing is effected by exposing the selected regions to an energy beam.

7. The method according to claim 6, further comprising repeating the applying and the selectively curing at least once to form a plurality of superimposed, at least partially contiguous, mutually adhered layers of the solder mask.

8. The method according to claim 1, further comprising removing the coverlet after the encapsulant material cures or sets.

9. The method according to claim 1, wherein the introducing the encapsulant material comprises using an encapsulant dispenser needle.

10. The method according to claim 1, further comprising removing the solder mask after the encapsulant material cures or sets.

11. The method according to claim 1, wherein the forming or positioning the at least one intermediate conductive element comprises forming a wire bond having a loop height.

12. The method according to claim 11, wherein the forming or placing the solder mask comprises forming or placing a solder mask having an outer surface at an elevation that exceeds an elevation of the loop height.

13. The method according to claim 1, further comprising positioning at least one aperture in the solder mask over another contact area electrically connected to the at least one contact area and located on the surface of the carrier substrate.

14. The method according to claim 13, further comprising forming or placing a discrete conductive element in the at least one aperture.

15. The method according to claim 1, wherein the forming or placing the solder mask comprises forming or placing a solder mask having a thickness of about 50 $\mu$m to about 100 $\mu$m.

16. The method according to claim 1, wherein the forming or placing the solder mask comprises forming or placing a solder mask having a thickness that positions an outer surface thereof at least about 25 $\mu$m beyond the predicted height of protrusion of the at least one intermediate conductive element.

17. A method for modifying a carrier substrate, comprising:
providing a carrier substrate including a central slot therethrough and at least one contact area on a surface thereof, proximate the central slot; and
forming or placing a solder mask including a central opening on the surface of the carrier substrate wherein an edge of the solder mask extends to an edge of the carrier substrate, including aligning the central opening of the solder mask with the central slot such that the central slot surrounds the central opening and the at least one contact area of the carrier substrate is exposed through the central opening.

18. The method according to claim 17, wherein the forming or placing the solder mask comprises providing a preformed solder mask on the surface of the carrier substrate.

19. The method according to claim 17, wherein the forming or placing the solder mask comprises:
applying a quantity of a photoimageable material to the surface of the carrier substrate; and
curing selected regions of the photoimageable material.

20. The method according to claim 19, wherein the curing comprises employing photolithographic techniques to expose the selected regions of the photoimageable material.

21. The method according to claim 20, further comprising developing the selected regions of the photoimageable material.

22. The method according to claim 19, wherein the curing comprises exposing the selected regions to an energy beam of a wavelength that cures the photoimageable material of the selected regions.

23. The method according to claim 22, further comprising repeating the applying and the curing at least once to form a plurality of superimposed, at least partially contiguous, mutually adhered layers of the solder mask.

24. The method according to claim 7, wherein the forming or placing the solder mask comprises forming or placing at least one aperture of the solder mask at least partially over another contact area electrically connected to the at least one first contact area and located on the surface of the carrier substrate.

25. A method of encapsulating conductive elements connecting a semiconductor die to a carrier substrate, comprising:
providing a solid carrier substrate comprising a centrally located slot formed therethrough;
aligning a solder mask having a central opening formed therethrough over at least a portion of a surface of the carrier substrate such that the central opening of the solder mask surrounds the central slot of the carrier substrate;
securing a semiconductor die to an opposite surface of the carrier substrate, the semiconductor die substantially covering the central slot of the solid carrier substrate;
positioning a coverlet over the central opening of the solder mask to substantially cover the central opening of the solder mask such that the coverlet leaves at least one end of the central opening of the solder mask open; and
introducing an encapsulant material into the at least one open end of the central opening of the solder mask such that the encapsulant flows into the central slot of the carrier substrate and is confined by the semiconductor die.

26. The method according to claim 25, further comprising removing the coverlet after the encapsulant material cures or sets.

27. The method according to claim 25, wherein the introducing the encapsulant material comprises using an encapsulant dispenser needle.

28. The method according to claim 25, further comprising removing the solder mask after the encapsulant material cures or sets.

* * * * *

UNITED STATES PATENT AND TRADEMARK OFFICE
CERTIFICATE OF CORRECTION

PATENT NO. : 6,984,545 B2
APPLICATION NO. : 10/201208
DATED : January 10, 2006
INVENTOR(S) : Grigg et al.

Page 1 of 1

It is certified that error appears in the above-identified patent and that said Letters Patent is hereby corrected as shown below:

In column 10, line 54, in Claim 25, after "encapsulant" insert -- material --.

Signed and Sealed this

Eighth Day of April, 2008

JON W. DUDAS
*Director of the United States Patent and Trademark Office*